(12) United States Patent
Jeon

(10) Patent No.: US 9,293,225 B2
(45) Date of Patent: Mar. 22, 2016

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventor: Byung Deuk Jeon, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/177,750

(22) Filed: Feb. 11, 2014

(65) Prior Publication Data

US 2015/0179283 A1    Jun. 25, 2015

(30) Foreign Application Priority Data

Dec. 24, 2013    (KR) .......................... 10-2013-0162039

(51) Int. Cl.
    *G11C 29/12*    (2006.01)
(52) U.S. Cl.
    CPC ...... *G11C 29/1201* (2013.01); *G11C 29/12015* (2013.01)
(58) Field of Classification Search
    CPC .................... G11C 29/1201; G11C 29/12015
    USPC .......... 365/201, 189.05, 189.16, 189.17, 193, 365/233.1
    See application file for complete search history.

(56) References Cited

U.S. PATENT DOCUMENTS

| 5,825,782 | A  * | 10/1998 | Roohparvar | G11C 29/34 365/185.29 |
|---|---|---|---|---|
| 5,983,375 | A  * | 11/1999 | Kim | G11C 29/28 365/201 |
| 6,172,938 | B1 | 1/2001 | Suzuki | G11C 7/1066 365/193 |
| 6,233,182 | B1 * | 5/2001 | Satou | G11C 29/006 365/200 |
| 6,405,150 | B1 * | 6/2002 | Rhodes | G11C 29/56 365/201 |
| 7,120,067 | B2 * | 10/2006 | Han | 365/189.05 |
| 7,447,954 | B2 * | 11/2008 | Shin | G11C 29/08 365/201 |
| 7,761,753 | B2 * | 7/2010 | Vogt | G06F 13/4243 365/200 |
| 8,176,370 | B2 * | 5/2012 | Lee | G11C 29/48 714/718 |
| 8,225,150 | B2 * | 7/2012 | Hur | G11C 29/12 714/718 |
| 2005/0007836 | A1 * | 1/2005 | Morzano | G11C 7/1066 365/193 |
| 2005/0162182 | A1 * | 7/2005 | Ong | G01R 31/31813 324/750.3 |
| 2008/0298138 | A1 * | 12/2008 | Arai | G11C 11/4096 365/189.05 |
| 2009/0273992 | A1 * | 11/2009 | Kim et al. | 365/193 |
| 2011/0227604 | A1 * | 9/2011 | Nakagawa | H03K 19/017545 326/16 |
| 2011/0280090 | A1 * | 11/2011 | Matsubara | G11C 29/08 365/193 |
| 2012/0170382 | A1 * | 7/2012 | Do | G11C 29/40 365/189.05 |
| 2013/0234342 | A1 | 9/2013 | Shibata et al. | |

FOREIGN PATENT DOCUMENTS

KR    1020120119960 A    11/2012

* cited by examiner

*Primary Examiner* — Vu Le
*Assistant Examiner* — Sung Cho
(74) *Attorney, Agent, or Firm* — William Park & Associates Ltd.

(57) ABSTRACT

Semiconductor device includes a first data input/output (I/O) portion suitable for storing data inputted thereto through a first pad in a first cell block in synchronization with a test data strobe signal or a first data strobe signal and suitable for outputting the data stored in the first cell block to the first pad, a second data I/O portion suitable for storing data inputted thereto through a second pad in a second cell block in synchronization with the test data strobe signal or a second data strobe signal and suitable for outputting the data stored in the second cell block to the second pad, and a connection portion suitable for electrically connecting the first and second pads to each other in a test mode. Related semiconductor systems are also provided.

16 Claims, 7 Drawing Sheets

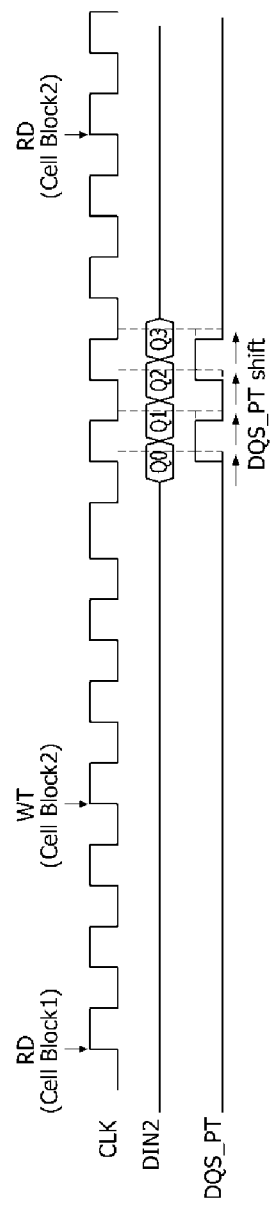

__SEMICONDUCTOR DEVICES AND SEMICONDUCTOR SYSTEMS INCLUDING THE SAME__

CROSS-REFERENCE TO RELATED APPLICATION

The present application claims priority under 35 U.S.C. 119(a) to Korean Application No. 10-2013-162039, filed on Dec. 24, 2013, in the Korean Intellectual Property Office, which is incorporated herein by reference in its entirety as set forth in full.

BACKGROUND

1. Technical Field

Embodiments of the present disclosure relate to semiconductor devices including a data strobe signal and semiconductor systems including the same.

2. Related Art

A system-in-package (SiP) technique and a chip-on-chip (CoC) technique have been widely used as packaging techniques for putting a large capacity of memory chip and a controller chip in a single package. The system-in-package (SiP) technique may use a wire bonding process to electrically connect a plurality of chips to each other. The chip-on-chip (CoC) technique may be a packaging technique which is suitable for the increase of memory capacity in a single package and for improvement of a data transmission speed between the memory chip and the controller chip in a single package. This is because the memory chip and the controller chip in the package communicate with each other through micro-bump pads.

The micro-bump pads may exhibit an excellent resistance characteristic, an excellent inductance characteristic and an excellent parasitic capacitance characteristic to allow the packages to operate at a high frequency. Thus, a data transmission speed may be improved by increasing the number of the micro-bump pads employed in the package. In the chip-on-chip (CoC) package, each of the memory chip and the controller chip may be fabricated to include the micro-bump pads and the micro-bump pads of the memory chip and the controller chip may be connected to each other to produce a single unified chip including the memory chip and the controller chip.

In semiconductor memory devices, test operations may be executed to verify the functions of buffers or drivers through which data are inputted or outputted. When semiconductor packages fabricated using the chip-on-chip (CoC) technique are tested, data may be inputted or outputted through the micro-bump pads of the semiconductor packages.

SUMMARY

Various embodiments are directed to semiconductor devices including a data strobe signal and semiconductor systems including the same.

According to some embodiments, a semiconductor device includes a first data input/output (I/O) portion suitable for storing data inputted thereto through a first pad in a first cell block in synchronization with a test data strobe signal or a first data strobe signal and suitable for outputting the data stored in the first cell block to the first pad, a second data I/O portion suitable for storing data inputted thereto through a second pad in a second cell block in synchronization with the test data strobe signal or a second data strobe signal and suitable for outputting the data stored in the second cell block to the second pad, and a connection portion suitable for electrically connecting the first and second pads to each other in a test mode. Related semiconductor systems are also provided.

According to further embodiments, a semiconductor device includes a first selection unit suitable for outputting a test data strobe signal or a first data strobe signal as a first selection strobe signal, a first input driver suitable for driving data inputted thereto through a first pad in response to a first write enablement signal to generate a first internal input data, a first data latch unit suitable for latching the first internal input data in synchronization with the first selection strobe signal and suitable for storing the latched data in a first cell block, a second selection unit suitable for outputting the test data strobe signal or a second data strobe signal as a second selection strobe signal, a second input driver suitable for driving data inputted thereto through a second pad in response to a second write enablement signal to generate a second internal input data, and a second data latch unit suitable for latching the second internal input data in synchronization with the second selection strobe signal and suitable for storing the latched data in a second cell block.

According to further embodiments, a semiconductor system includes a first semiconductor device and a second semiconductor device. The first semiconductor device generates an address signal, a command signal, a pattern data and a test data strobe signal and receives a verification data. The second semiconductor device includes a first cell block receiving and storing the pattern data and a test pad portion receiving the test data strobe signal. The second semiconductor device outputs data stored in the first cell block as the verification data in a test mode. The verification data is transmitted to the first semiconductor device.

According to further embodiments, the first write enablement signal, first read enablement signal, second write enablement signal, and second read enablement signal are received from a read/write controller in response to received internal address, read, and write signals, the internal address signal being generated in response to an internal address generator receiving an address signal external to the semiconductor device, and the read and write signals being generated in response to an internal command generator receiving a command signal external to the semiconductor device.

According to further embodiments, the first semiconductor device compares the verification data with the pattern data to verify whether the verification data is equal to the pattern data for determining whether the first data I/O portion and the second data I/O portion are operating normally.

BRIEF DESCRIPTION OF THE DRAWINGS

Embodiments of the present invention will become more apparent in view of the attached drawings and accompanying detailed description, in which:

FIGS. 4 to 7 are timing diagrams illustrating a method of verifying valid windows of data transmitted between cell blocks in a test mode.

DETAILED DESCRIPTION

Various embodiments of the present invention will be described hereinafter with reference to the accompanying drawings. However, the embodiments described herein are for illustrative purposes only and are not intended to limit the scope of the present invention.

Figure 1:
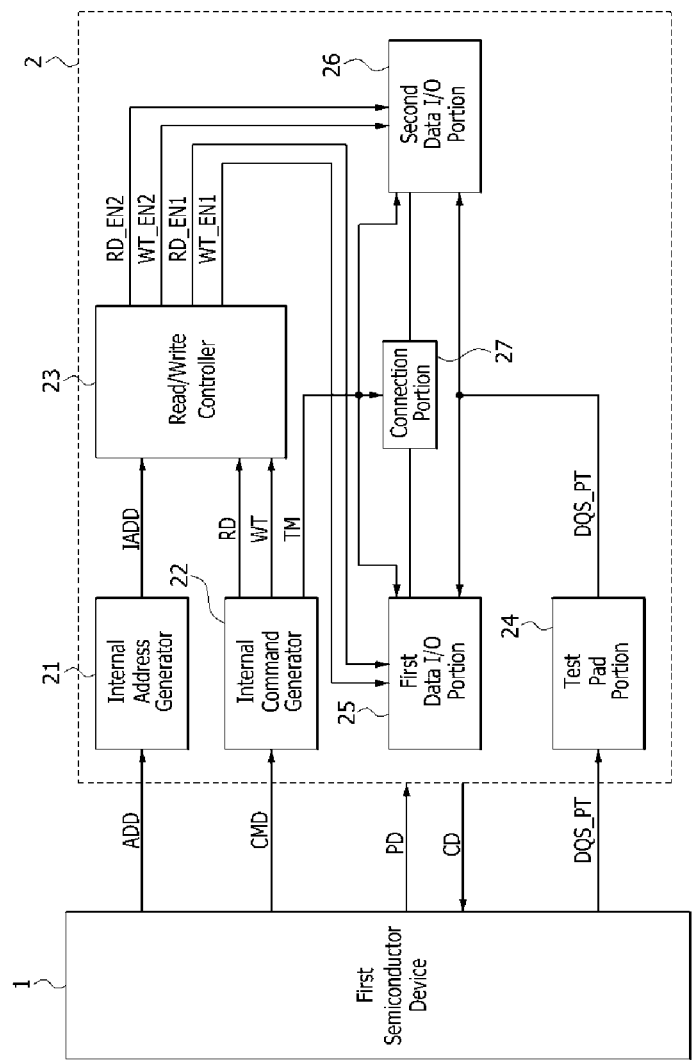
FIG. 1 is a block diagram illustrating a semiconductor system according to an embodiment of the present invention.

Referring to FIG. 1, a semiconductor system according to the present embodiment may include a first semiconductor device 1 and a second semiconductor device 2. The first semiconductor device 1 may apply an address signal ADD, a command signal CMD, a pattern data PD and a test data strobe signal DQS_PT to the second semiconductor device 2. The first semiconductor device 1 may receive verification data CD outputted from the semiconductor device 2 to control a timing of the test data strobe signal DQS_PT. The second semiconductor device 2 may include an internal address generator 21, an internal command generator 22, a read/write controller 23, a test pad portion 24, a first data input/output (I/O) portion 25, a second data input/output (I/O) portion 26 and a connection portion 27. The first and second semiconductor devices 1 and 2 may be realized on a single chip or multiple chips.

The internal address generator 21 may receive and decode the address signal ADD to generate an internal address signal IADD. The internal address signal IADD may include information on cell blocks in which a read operation or a write operation is executed.

The internal command generator 22 may receive and decode the command signal CMD to generate a read signal RD, a write signal WT and a test mode signal TM. The read signal RD may be enabled to execute a read operation, and the write signal WT may be enabled to execute a write operation. Further, the test mode signal TM may be enabled to execute a test mode.

The read/write controller 23 may generate a first read enablement signal RD_EN1, a first write enablement signal WT_EN1, a second read enablement signal RD_EN2 and a second write enablement signal WT_EN2 in response to the internal address signal IADD, the read signal RD and the write signal WT. The first read enablement signal RD_EN1 may be enabled to execute a read operation of a first cell block (256 of FIG. 2). The first write enablement signal WT_EN1 may be enabled to execute a write operation of the first cell block. The second read enablement signal RD_EN2 may be enabled to execute a read operation of a second cell block (266 of FIG. 2). The second write enablement signal WT_EN2 may be enabled to execute a write operation of the second cell block. In the test mode, the test pad portion 24 may receive the test data strobe signal DQS_PT supplied from the first semiconductor device 1 to transmit the test data strobe signal DQS_PT to the first and second data I/O portions 25 and 26. The first and second data I/O portions 25 and 26 may receive and store data inputted thereto in synchronization with the test data strobe signal DQS_PT in the test mode. The connection portion 27 may electrically connect a pad (251 of FIG. 2) of the first data I/O portion 25 to a pad (261 of FIG. 2) of the second data I/O portion 26 in the rest mode. The data stored in the first and second data I/O portions 25 and 26 may be inputted or outputted through the pads 251 and 261.

Figure 2:
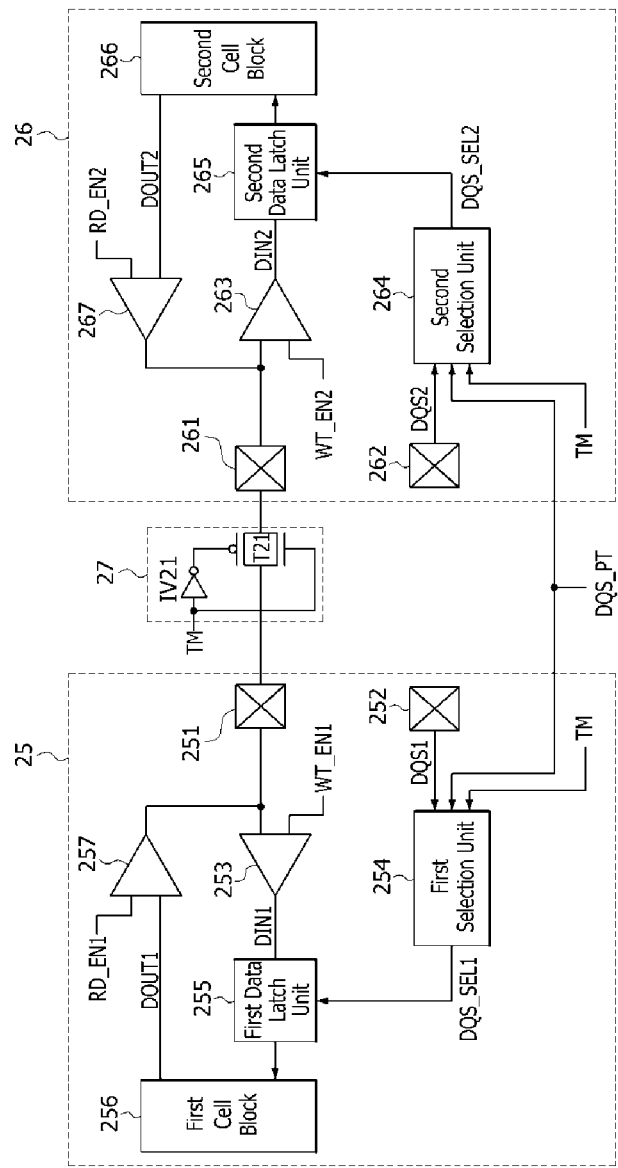
FIG. 2 is a block diagram illustrating a first data I/O portion, a second data I/O portion and a connection portion included in the semiconductor system of FIG. 1.

FIG. 2 illustrates configurations of the first data I/O portion 25, the second data I/O portion 26 and the connection portion 27 in more detail.

Referring to FIG. 2, the first data I/O portion 25 may include a first pad 251, a second pad 252, a first input driver 253, a first selection unit 254, a first data latch unit 255, a first cell block 256 and a first output driver 257.

The first pad 251 may be a data pad through which data are inputted or outputted. The first data I/O portion 25 may receive the pattern data PD outputted from the first semiconductor device 1, data outputted from a controller (not shown) and data outputted from the connection portion 27 through the first pad 251. Out of the test mode, the first data I/O portion 25 may receive a first data strobe signal DQS1 supplied from a controller (not shown) for a write operation of the first cell block 256 through the second pad 252. Each of the first and second pads 251 and 252 may be a micro-bump pad. The first input driver 253 may receive the data through the first pad 251 in response to the first write enablement signal WT_EN1 to drive a first internal input data DIN1. The first write enablement signal WT_EN1 may be enabled to execute a write operation of the first cell block 256. The first selection unit 254 may output the test data strobe signal DQS_PT or the first data strobe signal DQS1 as a first selection strobe signal DQS_SEL1 in response to the test mode signal TM. The first selection unit 254 may output the test data strobe signal DQS_PT as the first selection strobe signal DQS_SEL1 when the semiconductor system operates in the test mode. Meanwhile, the first selection unit 254 may output the first data strobe signal DQS1 as the first selection strobe signal DQS_SEL1 when the semiconductor system is out of the test mode. The first data latch unit 255 may latch the first internal input data DIN1 in synchronization with the first selection strobe signal DQS_SEL1 and may store the latched data in the first cell block 256. The first output driver 257 may drive a first internal output data DOUT1 outputted from the first cell block 256 in response to the first read enablement signal RD_EN1 and may output the first internal output data DOUT1 to the first pad 251. The first read enablement signal RD_EN1 may be enabled to execute a read operation of the first cell block 256.

The second data I/O portion 26 may include a third pad 261, a fourth pad 262, a second input driver 263, a second selection unit 264, a second data latch unit 265, a second cell block 266 and a second output driver 267.

The third pad 261 may be a data pad through which data is inputted or outputted. The second data I/O portion 26 may receive the pattern data PD outputted from the first semiconductor device 1, data outputted from a controller (not shown) and data outputted from the connection portion 27 through the third pad 261. Out of the test mode, the second data I/O portion 26 may receive a second data strobe signal DQS2 supplied from a controller (not shown) for a write operation of the second cell block 266 through the fourth pad 262. Each of the third and fourth pads 261 and 262 may be a micro-bump pad. The second input driver 263 may receive the data through the third pad 261 in response to the second write enablement signal WT_EN2 to drive a second internal input data DIN2. The second write enablement signal WT_EN2 may be enabled to execute a write operation of the second cell block 266. The second selection unit 264 may output the test data strobe signal DQS_PT or the second data strobe signal DQS2 as a second selection strobe signal DQS_SEL2 in response to the test mode signal TM. The second selection unit 264 may output the test data strobe signal DQS_PT as the second selection strobe signal DQS_SEL2 when the semiconductor system operates in the test mode. Meanwhile, the second selection unit 264 may output the second data strobe signal DQS2 as the second selection strobe signal DQS_SEL2 when the semiconductor system is out of the test mode. The second data latch unit 265 may latch the second internal input data DIN2 in synchronization with the second selection strobe signal DQS_SEL2 and may store the latched data in the second cell block 266. The second output driver 267 may drive a second internal output data DOUT2 outputted from the second cell block 266 in response to the second read enablement signal RD_EN2 and may output the second internal output data DOUT2 to the third pad 261. The second read enablement signal RD_EN2 may be enabled to execute a read operation of the second cell block 266.

The connection portion 27 may include an inverter IV21 inversely buffering the test mode signal TM and a transfer gate T21 turned on in response to the test mode signal TM and an output signal of the inverter IV21. The connection portion 27 may transmit the data outputted from the first pad 251 to the third pad 261 or may transmit the data outputted from the third pad 261 to the first pad 251 through the transfer gate T21 which is turned on when the test mode signal TM having a logic "high" level is inputted to the transfer gate T21 in the test mode.

Figure 3:
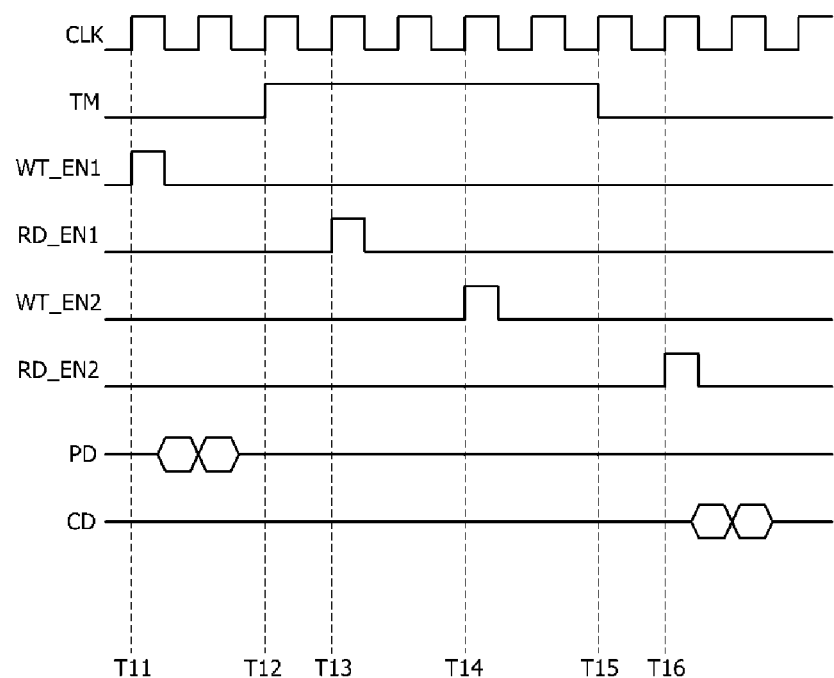
FIG. 3 is a timing diagram illustrating a test mode operation executed to verify a normality/abnormality of an interface in the semiconductor system of FIGS. 1 and 2.

A test mode operation executed to verify a normality/abnormality of an interface of the semiconductor system shown in FIGS. 1 and 2 will be described more fully hereinafter with reference to FIG. 3.

At a point of time "T11", if the first write enablement signal WT_EN1 is enabled to execute a write operation of the first cell block 256, the pattern data PD outputted from the first semiconductor device 1 may be stored in the first cell block 256. At a point of time "T12", if the semiconductor system enters the test mode, a level of the test mode signal TM may be changed from a logic "low" level to a logic "high" level. At a point of time "T13", if the first read enablement signal RD_EN1 is enabled to execute a read operation of the first cell block 256, the data stored in the first cell block 256 may be outputted through the first pad 251 and may be transmitted to the third pad 261 through the connection portion 27 which is turned on by the test mode signal TM. At a point of time "T14", if the second write enablement signal WT_EN2 is enabled to execute a write operation of the second cell block 266, the data inputted through the third pad 261 may be stored in the second cell block 266. At a point of time "T15", if the test mode terminates, a level of the test mode signal TM may be changed from a logic "high" level to a logic "low" level. At a point of time "T16", if the second read enablement signal RD_EN2 is enabled to execute a read operation of the second cell block 266 after termination of the test mode, the data stored in the second cell block 266 may be outputted as the verification data CD through the third pad 261 and the verification data CD may be transmitted to the first semiconductor device 1.

The first semiconductor device 1 may compare the verification data CD with the pattern data PD to verify a normality/abnormality of an I/O interface including the first input driver 253, the first output driver 257, the second input driver 263 and the second output driver 267. That is, the I/O interface may be regarded as normally operating if the verification data CD is equal to the pattern data PD, and the I/O interface may be regarded as abnormally operating if the verification data CD is different from the pattern data PD.

Hereinafter, a method of verifying valid windows of data transmitted through the connection portion 27 will be described in detail with reference to FIGS. 4 to 7 in conjunction with an example in which the data stored in the first cell block 256 is transmitted to the second cell block 266 through the connection portion 27 and stored in the second cell block 266.

Figure 4:
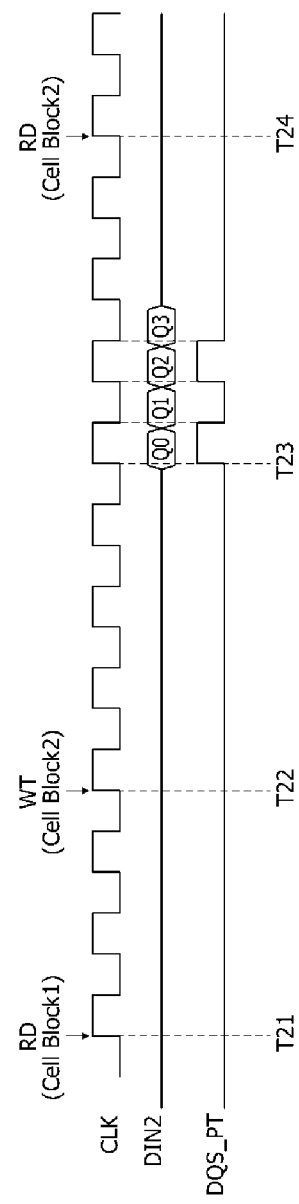

Referring to FIG. 4, if a read operation of the first cell block 256 is executed at a point of time "T21" and a write operation of the second cell block 266 is then executed at a point of time "T22", the data stored in the first cell block 256 may be transmitted to the second cell block 266 through the connection portion 27. At a point of time "T23", the second cell block 266 may receive the second internal input data DIN2 in synchronization with the test data strobe signal DQS_PT and may store the second internal input data DIN2 therein. If a read operation of the second cell block 266 is executed at a point of time "T24, the data stored in the second cell block 266 may be outputted as the verification data CD and the verification data CD may be transmitted to the first semiconductor device 1. The first semiconductor device 1 may verify a valid window of the data transmitted through the connection portion 27 by controlling a timing of the test data strobe signal DQS_PT in response to the verification data CD.

The first semiconductor device 1 may verify the valid windows of the data transmitted through the connection portion 27 by repeatedly performing an operation of sensing logic levels of respective bits Q0, Q1, Q2 and Q3 included in the verification data CD and an operation of controlling a timing of the test data strobe signal DQS_PT. The valid windows of the data may be verified by an operation of shifting the test data strobe signal DQS_PT after synchronizing central points of the data with rising edges and falling edges of the test data strobe signal DQS_PT.

Figure 5:
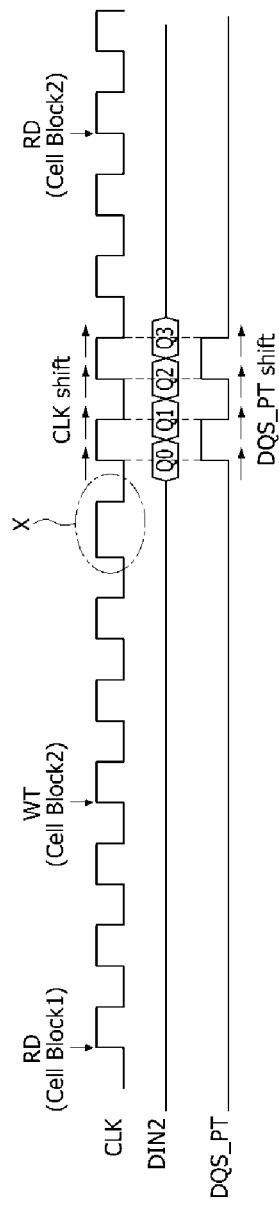
Figure 6:
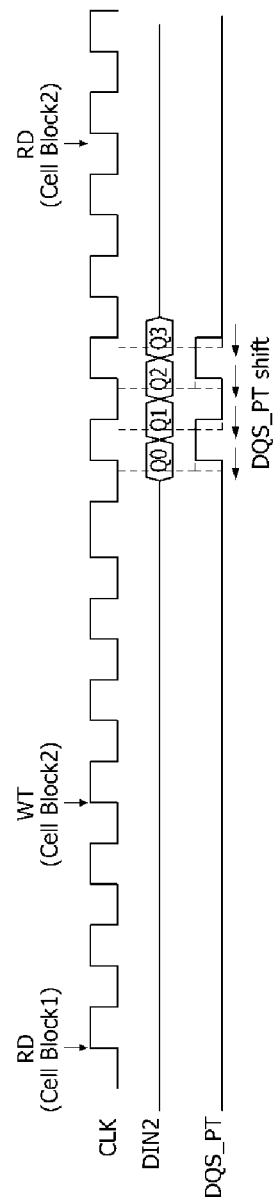

More specifically, as illustrated in FIG. 5, the first semiconductor device 1 may synchronize the central points of the data transmitted through the connection portion 27 with the rising edges and the falling edges of the test data strobe signal DQS_PT by controlling a pulse width (see a portion "X" of FIG. 5) of a clock signal CLK inputted in advance of the test data strobe signal DQS_PT to shift both the clock signal CLK and the test data strobe signal DQS_PT. The test data strobe signal DQS_PT may be generated from the clock signal CLK. Thus, if the clock signal CLK is shifted, the test data strobe signal DQS_PT may also be shifted. Next, the first semiconductor device 1 may verify the valid windows of the data transmitted through the connection portion 27 by shifting the test data strobe signal DQS_PT leftward as shown in FIG. 6 or rightward as shown in FIG. 7. That is, the first semiconductor device 1 may verify or confirm a period of a valid data by repeatedly sensing the logic levels of the respective bits Q0, Q1, Q2 and Q3 included in the verification data CD whenever the test data strobe signal DQS_PT is shifted by a predetermined period.

According to the embodiments as set forth above, a semiconductor system may control a timing of a data strobe signal to provide a test mode verifying a valid window of a data which is internally transmitted. Thus, a normality/abnormality of an interface in the semiconductor system may be readily verified even at a wafer level before the semiconductor system is packaged.

What is claimed is:
1. A semiconductor device comprising:
a first data input/output (I/O) portion suitable for storing data inputted thereto through a first pad in a first cell block in synchronization with a test data strobe signal or a first data strobe signal and suitable for outputting the data stored in the first cell block to the first pad;
a second data I/O portion suitable for storing data inputted thereto through a second pad in a second cell block in synchronization with the test data strobe signal or a second data strobe signal and suitable for outputting the data stored in the second cell block to the second pad; and
a connection portion suitable for directly connecting the first and second pads to each other in a test mode,
wherein the first data I/O portion includes a third pad to which the first data strobe signal is applied when a write operation of the first cell block is executed out of the test mode; and wherein the second data I/O portion includes a fourth pad to which the second data strobe signal is applied when a write operation of the second cell block is executed out of the test mode.

2. The semiconductor device of claim 1, further comprising a test pad portion to which the test data strobe signal is applied in the test mode.

3. The semiconductor device of claim 1,
wherein the test data strobe signal is supplied from a test apparatus for executing the test mode; and
wherein the first and second data strobe signals are supplied from a controller.

4. The semiconductor device of claim 1, wherein the first data I/O portion includes:
a first selection unit suitable for outputting the test data strobe signal or the first data strobe signal as a first selection strobe signal;
a first input driver suitable for driving data inputted thereto through the first pad in response to a first write enablement signal to generate a first internal input data; and
a first data latch unit suitable for latching the first internal input data in synchronization with the first selection strobe signal and suitable for storing the latched data in the first cell block.

5. The semiconductor device of claim 4, wherein the first data I/O portion further includes a first output driver that is suitable for driving a first internal output data stored in the first cell block in response to a first read enablement signal to output the driven signal to the first pad.

6. The semiconductor device of claim 5,
wherein the first write enablement signal is enabled when a write operation of the first cell block is executed; and
wherein the first read enablement signal is enabled when a read operation of the first cell block is executed.

7. The semiconductor device of claim 1, wherein the second data I/O portion includes:
a second selection unit suitable for outputting the test data strobe signal or the second data strobe signal as a second selection strobe signal;
a second input driver suitable for driving data inputted thereto through the second pad in response to a second write enablement signal to generate a second internal input data; and
a second data latch unit suitable for latching the second internal input data in synchronization with the second selection strobe signal and suitable for storing the latched data in the second cell block.

8. The semiconductor device of claim 7, wherein the second data I/O portion further includes a second output driver that is suitable for driving a second internal output data stored in the second cell block in response to a second read enablement signal to output the driven signal to the second pad.

9. The semiconductor device of claim 8,
wherein the second write enablement signal is enabled when a write operation of the second cell block is executed; and
wherein the second read enablement signal is enabled when a read operation of the second cell block is executed.

10. The semiconductor device of claim 1, wherein the connection portion includes a transfer gate that is turned on in response to a test mode signal enabled in the test mode.

11. A semiconductor device comprising:
a first selection unit suitable for outputting a test data strobe signal or a first data strobe signal as a first selection strobe signal;
a first input driver suitable for driving data inputted thereto through a first pad in response to a first write enablement signal to generate a first internal input data;
a first data latch unit suitable for latching the first internal input data in synchronization with the first selection strobe signal and suitable for storing the latched data in a first cell block;
a second selection unit suitable for outputting the test data strobe signal or a second data strobe signal as a second selection strobe signal;
a second input driver suitable for driving data inputted thereto through a second pad in response to a second write enablement signal to generate a second internal input data;
a second data latch unit suitable for latching the second internal input data in synchronization with the second selection strobe signal and suitable for storing the latched data in a second cell block;
a connection portion suitable for directly connecting the first and second pads to each other in a test mode;
a third pad to which the first data strobe signal is applied when a write operation of the first cell block is executed out of the test mode; and
a fourth pad to which the second data strobe signal is applied when a write operation of the second cell block is executed out of the test mode.

12. The semiconductor device of claim 11, further comprising a test pad portion to which the test data strobe signal is applied in a test mode.

13. The semiconductor device of claim 11, further comprising:
a first output driver suitable for driving a first internal output data stored in the first cell block in response to a first read enablement signal to output the driven signal to the first pad; and
a second output driver suitable for driving a second internal output data stored in the second cell block in response to a second read enablement signal to output the driven signal to the second pad.

14. The semiconductor device of claim 13,
wherein the first write enablement signal is enabled when a write operation of the first cell block is executed;
wherein the first read enablement signal is enabled when a read operation of the first cell block is executed;
wherein the second write enablement signal is enabled when a write operation of the second cell block is executed; and
wherein the second read enablement signal is enabled when a read operation of the second cell block is executed.

15. A semiconductor system comprising:
a first semiconductor device suitable for generating an address signal, a command signal, a pattern data and a test data strobe signal and suitable for receiving a verification data; and
a second semiconductor device including a first cell block suitable for receiving and storing the pattern data and a test pad portion suitable for receiving the test data strobe signal,
wherein the second semiconductor device outputs data stored in the first cell block as the verification data in a test mode, and
wherein the verification data is transmitted to the first semiconductor device, and the second semiconductor device includes a connection portion suitable for directly connecting the first pad to a second pad in the test mode, wherein the second semiconductor device includes:
a first data input/output (I/O) portion suitable for outputting data stored in the first cell block to a first pad when a read operation of the first cell block is executed in the test mode; and
a second data I/O portion suitable for storing data outputted from the second pad through the connection portion in a second cell block in synchronization with the test data strobe signal when a write operation of the second cell block is executed in the test mode and suitable for outputting data stored in the second cell block as the verification data through the second pad when a read operation of the second cell block is executed in the test mode.

16. The semiconductor system of claim 15, wherein the first semiconductor device receives the verification data to control a timing of the test data strobe signal.

* * * * *